United States Patent [19]
Jove et al.

[11] Patent Number: 4,706,138
[45] Date of Patent: Nov. 10, 1987

[54] AMPLIFICATION OF SIGNALS PRODUCED BY A MAGNETIC SENSOR

[75] Inventors: Stephen A. Jove, Watsonville; Klaas B. Klaassen, San Jose, both of Calif.

[73] Assignee: International Business Machines Corporation, Armonk, N.Y.

[21] Appl. No.: 851,649

[22] Filed: Apr. 14, 1986

[51] Int. Cl.[4] .......................... G11B 5/02; G11B 5/127
[52] U.S. Cl. ........................................ 360/67; 360/113
[58] Field of Search ................... 360/113, 67; 324/249, 324/252; 330/62

[56] References Cited

U.S. PATENT DOCUMENTS 4,492,997  1/1985  Arai et al. ............................. 360/113

Primary Examiner—Vincent P. Canney
Attorney, Agent, or Firm—F. David LaRiviere; Henry E. Otto, Jr.

[57] ABSTRACT

A transimpedance amplifier for biasing and amplifying the signals produced by a magnetoresistive element is provided. Electrically, the resistance of the element is disposed as degenerative feedback in the emitter circuit of a differential pair comprising the input stage of the amplifier. Bias current for the element is supplied by the same current source that supplies current to the differential pair. DC feedback to the input stage balances current flow in both paths of the differential input stage to correct for DC offset arising in the output from variations transistor characteristics and the steady-state value of the magnetoresistive element. The amplified signal, representing $\Delta R_h/R_h$, is sensed as a current through the magnetoresistive element, where $\Delta R_h$ is the change in steady-state resistance, $R_h$, of the element.

13 Claims, 8 Drawing Figures

4,706,138

AMPLIFICATION OF SIGNALS PRODUCED BY A MAGNETIC SENSOR

CROSS-REFERENCE TO RELATED APPLICATION

The present invention is related to the invention described in the U.S. Patent application entitled, "Method and Apparatus for Reading Recorded Data by a Magnetoresistive Head", Ser. No. 767,549 filed Aug. 20, 1985 by Klaas B. Klaassen and assigned to the assignee hereof, and is incorporated by reference as if fully set forth herein.

BACKGROUND OF THE INVENTION

Most existing magnetoresistive (MR) sensors, including particularly sensors for bubble memories and magnetic recording, are biased at a constant bias current by preamplifiers which detect the signal voltage developed at the sensor terminals. Since stripe height is inversely proportional to sensor resistance, and varies from sensor to sensor owing to production variations and varies over the life of the sensor in contact recording applications owing to wear, it is desirable to detect signals produced by the sensor which are independent of stripe height. Thus, as shown in the related application, it is desirable to detect and amplify a voltage representing $\Delta R_h/R_h$, where $\Delta R_h$ is the change in MR sensor resistance, $R_h$, arising from the magnetic input signal from the media being read.

SUMMARY OF THE INVENTION

According to the present invention, an enhanced transimpedance amplifier is used for biasing and amplifying the signals produced by an MR read sensor. Electrically, the resistance, $R_h$, of the MR sensor is disposed as degenerative feedback in the emitter circuit of a differential pair comprising the input stage of the amplifier. In this circuit configuration, a signal representing $\Delta R_h/R_h$ is sensed and amplified as a current through the MR sensor.

Bias current for the MR sensor is supplied by the same constant current source that supplies current to both transistors comprising the input stage of the amplifier. To correct for direct current (DC) offset arising from variations in input stage transistor characteristics and the steady-state value of $R_h$, DC feedback to the input stage, via a level shift and amplifying stage, balances current flow in both paths of the differential input stage. It should be noted that the steady-state value of $R_h$ refers to the resistance value of $R_h$ while biased but not sensing magnetic field variations.

In addition, a feed forward current source, which injects an offset current into the last-mentioned DC feedback loop, may be used to correct for the DC error at the output of the amplifier. The amount of current can be selected to eliminate the error for nominal values of steady-state sensor resistance $R_h$, and to minimize the error in the general case. It should be noted that nominal, in regard to the value of $R_h$, refers to that steady-state value of $R_h$ most often occurring in production quantities.

The input stage of the amplifier of the present invention may be replicated as many times as there are MR sensors in a given system. The remaining components of the amplifier comprise the output and feedback stages which are common to all, and switched among, the input stages in a multiple-head system.

The sensitivity of the amplifier of the present invention to $\Delta R_h/R_h$ signals may be increased and the sensitivity to variations in $R_h$ may be decreased by additional circuitry. Further additional circuitry may be added to shorten setting time when MR sensors having different steady state resistance values, $R_h$, are activated and deactivated in a multiple sensor system.

DESCRIPTION OF THE PREFERRED EMBODIMENT

Figure 1:
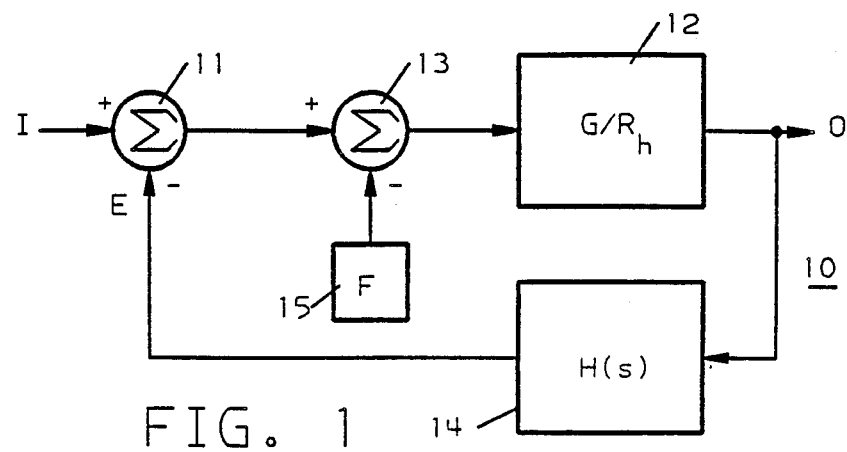
FIG. 1 is a block diagram of the basic concept of an amplifier constructed according to the principles of the present invention.

Referring first to FIG. 1, input I from an MR sensor is applied to summer 11 of amplifier 10. Since $\Delta R_h$ is proportional to the resistance value of $R_h$, the output signal can be made independent of variations in the value of $R_h$ arising from variations in stripe height and length by dividing the total gain of the system by $R_h$. Thus, the forward transfer function of gain stage 12 is G divided by $R_h$. The reverse transfer function, H, of feedback 14 can be modified by setting dominant low frequency poles, Pd, in a low pass configuration to produce a high pass characteristic of the system at the output, O. The high pass characteristic is obtained by subtracting error signal, E, produced by network 14, from the input, I, at summer 11. Finally, feed forward correction, F, from source 15 for correcting DC offset at output O is introduced at summer 13.

Figure 2A:
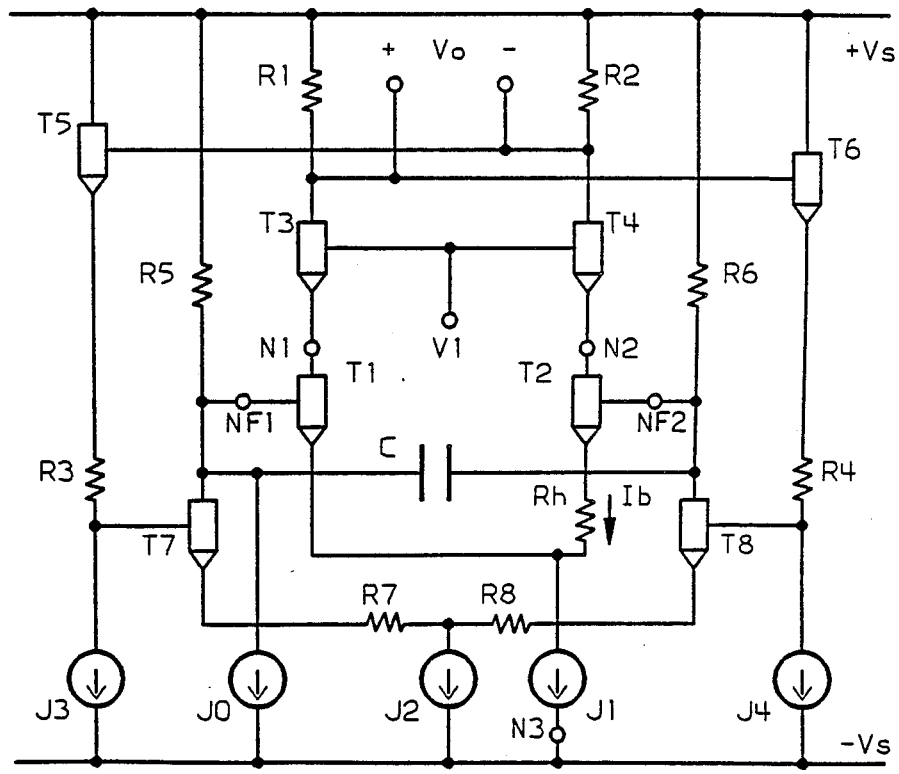
FIG. 2A is a circuit diagram of an amplifier implemented according to FIG. 1.

The input I contains an undesirable DC component arising from the voltage drop across the sensor caused by the bias current. This DC component may create an error at output O. Therefore, subtracting the nominal value of the DC component in I from the input to the forward gain path (G/R) eliminates the error in output O for the nominal values $R_h$, and significantly reduces the error in O for the general case of $R_h$ values at or near the tolerance limit of acceptable values at or near the The concept of FIG. 1 may be implemented as shown in FIG. 2A. Bias current, $I_b$, for the MR sensor, $R_h$, is supplied by current source J1. Initially, the current through input devices T1 and T2 may be different and will cause an output offset across R1 and R2, voltage followers T5 and T6, each coupled to constant current sources J3 and J4, respectively, shift the DC potential of this offset and apply it to feedback differential pair, T7 and T8. Thus, the voltage at the bases of input devices T1 and T2 is corrected so that one-half of the current from current source J1 flows in each input device T1 and T2. The current supplied by constant current source J1 is approximately $2I_b$. Differential pair, T7 and T8, are supplied current by constant current source J2.

Since input devices T1 and T2 have inherently low input impedance at their emitters, the circuit is a transimpedance amplifier. In addition, $R_h$ acts as a degenerative feedback resistor. Thus, $\Delta R_h/R_h$ is sensed as a current through $R_h$.

Figure 2B:
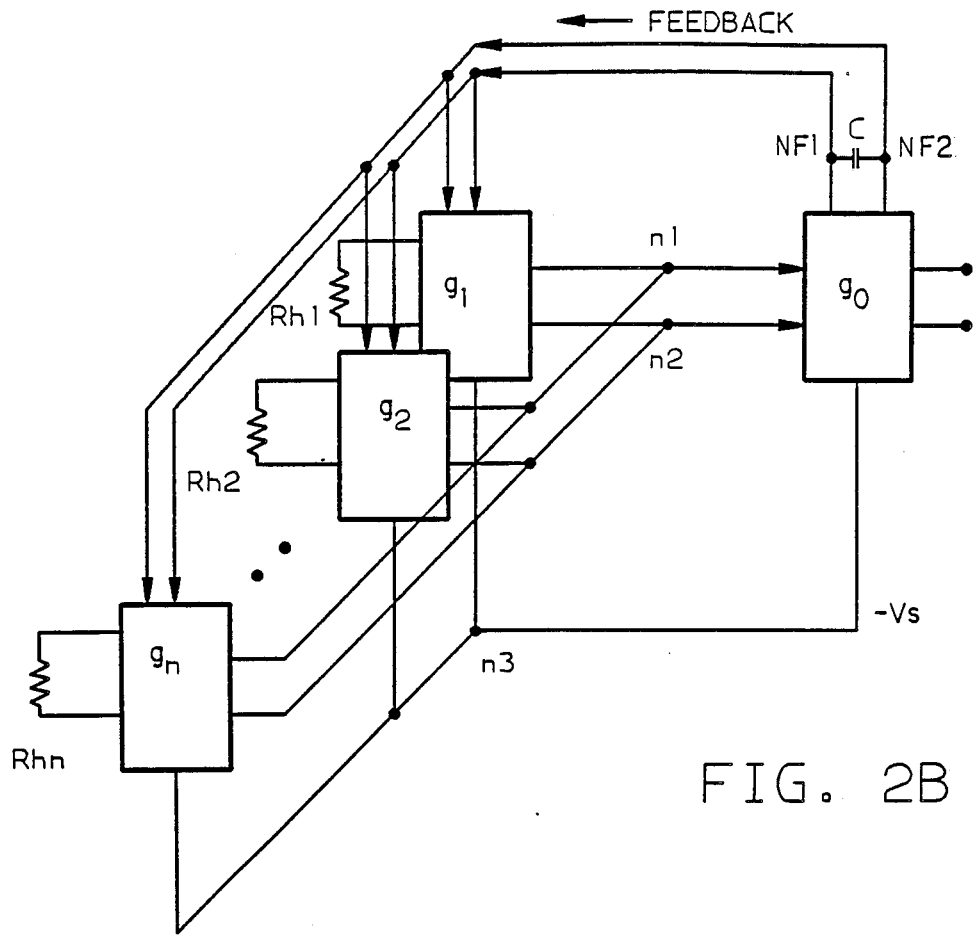
FIG. 2B is a block diagram which shows the coupling of input stages to the common stage of the amplifier.

Referring now also to FIG. 2B, nodes N1, N2 and N3 and NF1 and NF2 define common nodes joining separate circuits. The first circuit, comprising input devices T1 and T2, $R_h$ and current source J1, is the basic input stage for each MR sensor. The remaining components shown in FIG. 2A comprise the output and feedback stages, hereafter collectively referred to as $g_0$, which are common to one or more basic input stages. Thus, each MR sensor, $R_{h1}$, $R_{h2}$... $R_{hn}$, has a separate input stage, $g_1$, $g_2$, ... $g_n$, which can be activated or deactivated by activating or deactivating their respective current sources, J1.

With continuing reference to FIG. 2A, capacitor C, coupled between the bases of T1 and T2, is used to produce a dominant low frequency pole as indicated in FIG. 1. The location of the pole is determined by the value of C, R5, R6 and the loop gain, i.e. $GH/R_h$. Current source J0 injects a feed-forward offset current into the feedback loop to balance the collector voltages of output cascade pair T3 and T4 for nominal MR resistance, $R_h$, and minimizes such output offset in the general case for a range of steady-state values of $R_h$.

The values of resistors R1, R2, R3, R4, R5, R6, R7 and R8 are selected to provide suitable voltage biasing for their respective active devices. Furthermore, the circuit of FIG. 2A is particularly well-suited to implementation in any number of different integrated circuit technologies, since only one capacitor, which could be an off-chip component, is required.

The output voltage, $V_{out}$, of the amplifier of the present invention is related to the input impedance, $R_{in}$, as seen by $R_h$ as given below, $$V_{out} \propto \frac{\Delta R_h I_b}{R_{in} + R_h}.$$

Therefore, $$V_{out} \propto \frac{\Delta R_h}{R_h} I_b \text{ as } R_{in} \to 0.$$

Thus, the lower the value of $R_{in}$, the less sensitive $V_{out}$ will be to a wider range of variations in the steady-state value of $R_h$.

Figure 3:
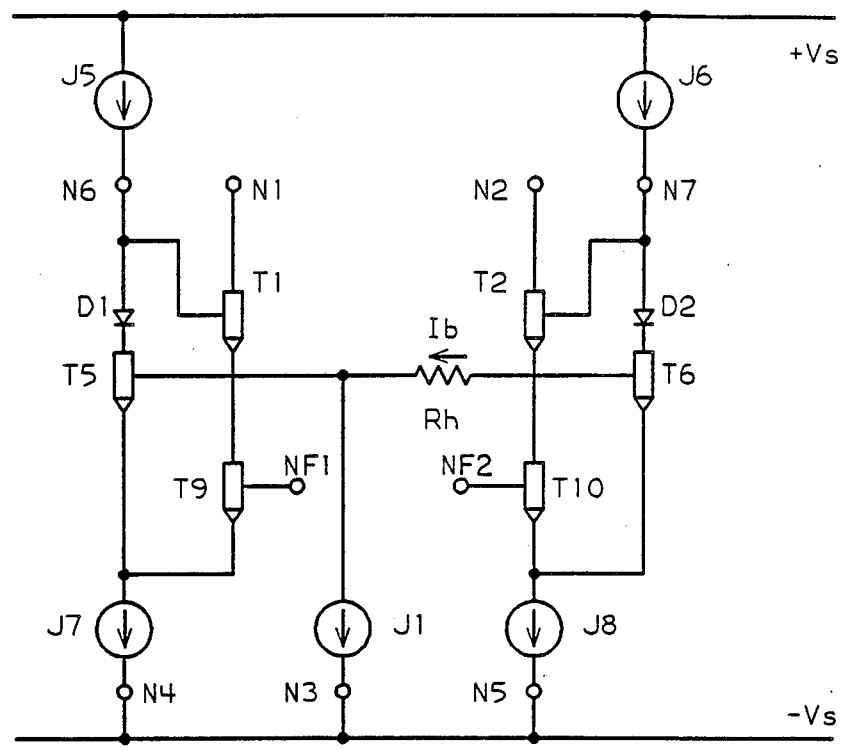
FIG. 3 is a circuit diagram for enhancing $\Delta R_h/R_h$ sensitivity of the amplifier of FIG. 2A.

For assuring very low input impedance, $R_{in}$, presented to the MR sensor, $R_h$, the present invention may include the compound input stage of FIG. 3. The circuit of FIG. 3 includes additional current sources J5 and J6, which are common to all input stages. Transistors $T_5$, $T_6$, $T_9$ and $T_{10}$, and diodes $D_1$ and $D_2$ are all repeated for each input stage. Then, additional nodes separating the common from the repeated parts of the circuit are identified at N4, N5, N6 and N7.

Wide-band performance for the circuit of FIG. 2A is desirable and obtainable by (1) setting the dominant low frequency pole for good low frequency response, and (2) by adding a cascaded common-base stage comprising $T_3$, $T_4$ and $V_1$ for good high frequency response. However, too much recovery time is required for stabilizing such a circuit when switching over from one sensor to another, i.e. deactivating one sensor and associated input stage and activating another. Obviously, if the forward gain G were increased, the dominant low frequency pole would move up in frequency and recovery time would decrease. Since that solution is undesirable for overall performance, the present invention includes a circuit for moving the dominant low frequency pole only during switchover.

Figure 4:
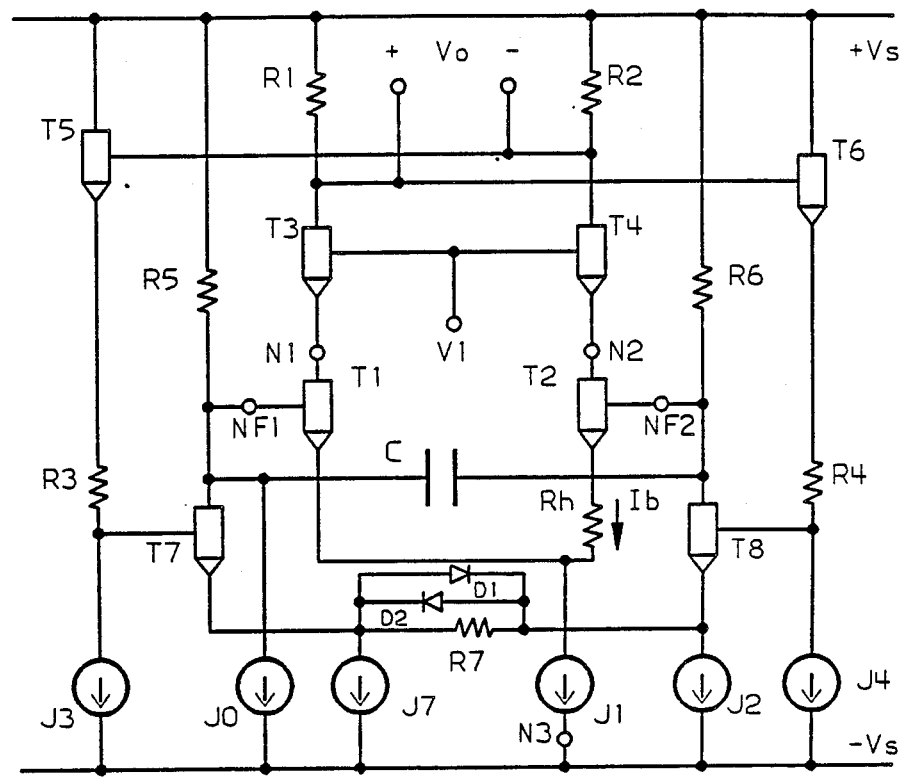
FIG. 4 is a circuit diagram for improving transient response of the amplifier FIG. 2A when switched between MR sensors having different resistance.

The circuit of FIG. 4 comprises a non-linear feedback loop which improves the transient response of the circuit of FIG. 2A when successively switching over input stages having different values of $R_h$. Diodes D1 and D2, resistor R7 and current source J7 comprise additions to the common output/feedback stage of FIG. 2A. These last-mentioned components produce higher gain for reverse transfer function network 14, shown in FIG. 1, for large error signals. In particular, as the impedance of diodes $D_1$ and $D_2$ decreases with increasing current therethrough, the degenerative resistance in the emitter circuit of the differential pair T7 and T8 is further reduced for large input signals. Thus, the dominant low frequency pole, Pd, tends to move up in frequency for a faster transient response in accordance with the relation $$O/I = [(1/Ho)(s+Pd)]/[R_h/GHo)(s+Pd)+1] \quad (1)$$

where Ho = DC gain of the reverse path of the feedback loop, s = Laplace operator, Pd = dominant pole, $R_h$ = sensor resistance and G = the uncorrected gain of the forward path of the feedback loop. In accordance with Equation (1), as the error signal approaches the steady state value, the low frequency pole tends to move back to the initial frequency for good low frequency response at output O.

Figure 5:
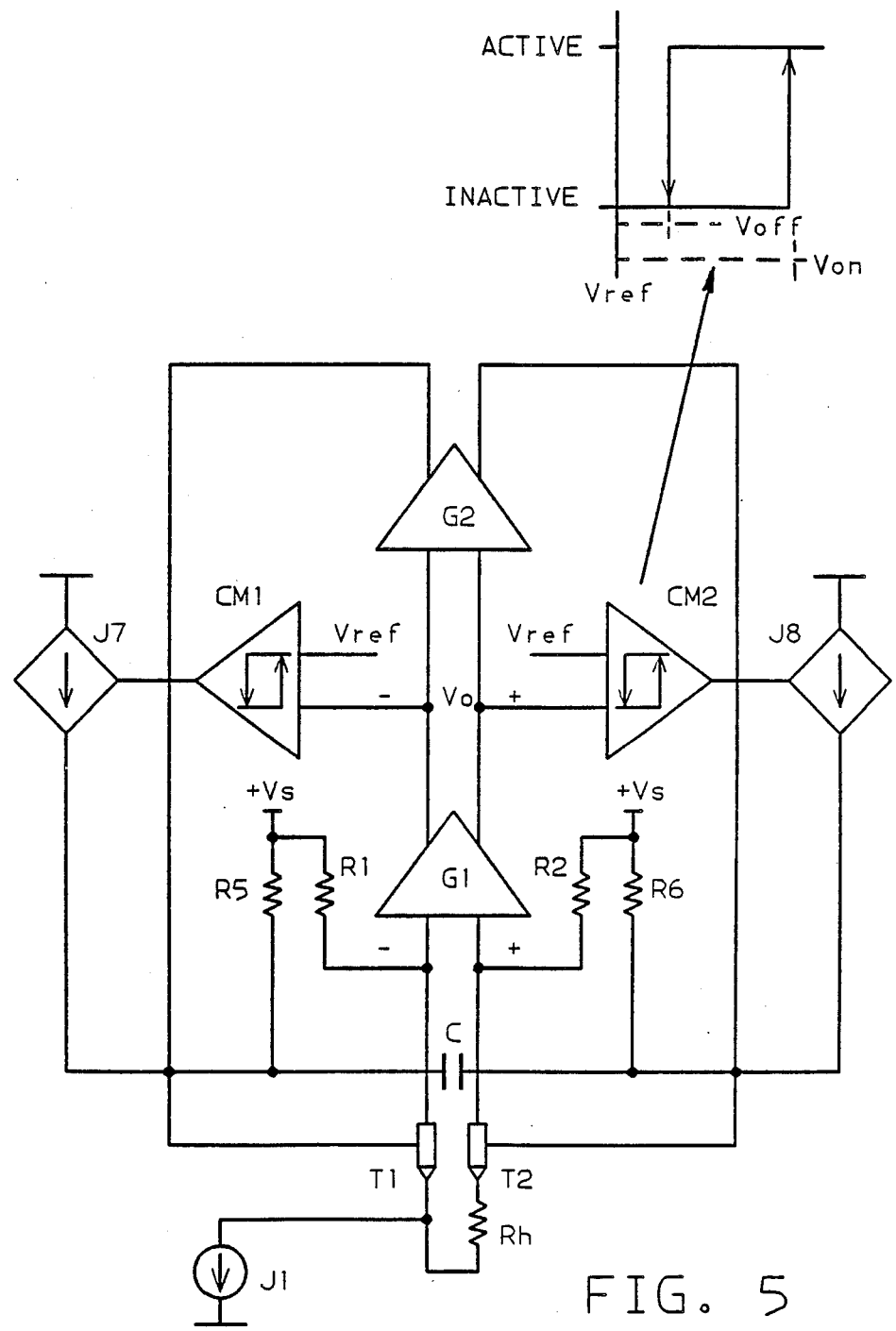
FIG. 5 is a block diagram of elements for reducing the settling time of the amplifier FIG. 2A when MR sensors having different resistance are activated and deactivated in a multiple-sensor system.

FIG. 5 illustrates the principle of a non-linear feedback loop for reducing the time required for the amplifier to settle into steady-state operation after one input stage is deactivated and another is activated. The non-linear feedback loop is active only during part of the transition time when switching between input stages. While active, this feedback loop introduces additional current to capacitor C to reduce the relatively long charge and discharge times thereof, which current is otherwise limited by its value and the charging current supplied by current source J2 as shown in FIG. 2A.

With continuing reference to FIGS. 2B and 5, when $R_{h1}$ is biased for steady-state operation, the voltage across capacitor C is fixed and maintained by feedback. If $R_{h1}$ is then deactivated and $R_{h2}$ is activated, where $R_{h2}$ is greater than $R_{h1}$, then a DC offset voltage appears at the output, $V_0$. Employing preselectable hysteresis in comparator CM2, if $V_0$ then exceeds $V_{ref}$ by $V_{on}$, then a comparator CM2 activates current source J8. Capacitor C is quickly charged to its new bias voltage because current source J8 temporarily provides substantially greater current than the charging current of $G_1$ (i.e., current source J2 as shown in FIG. 2A). When the new steady-state operating voltage is achieved, the DC offset at $V_O$ is decreased. When the DC offset $V_O$ is decreased below $V_{off}$, which is less than $V_{on}$, then comparator CM2 deactivates current source J8 and the linear feedback loop comprising $G_1$, $G_2$ and the input stage further reduces any residual offset at $V_0$. Likewise, if sensor $R_{h2}$ is switched off and new sensor $R_{h3}$ is switched on, where $R_{h3}$ is less than $R_{h2}$, comparator CM1 will operate to discharge capacitor C with current source J7.

The voltage level $V_{on}$ is selected so that noise or other device parameter variations do not cause activation of comparators CM1 or CM2 while, at the same time, allowing operation of the comparators for small differences between activated and deactivated MR sensors. The voltage level $V_{off}$ is selected so that the comparators will not switch off too soon to provide minimum transient response of the amplifier while providing an adequate margin of loop stability.

Figure 6:
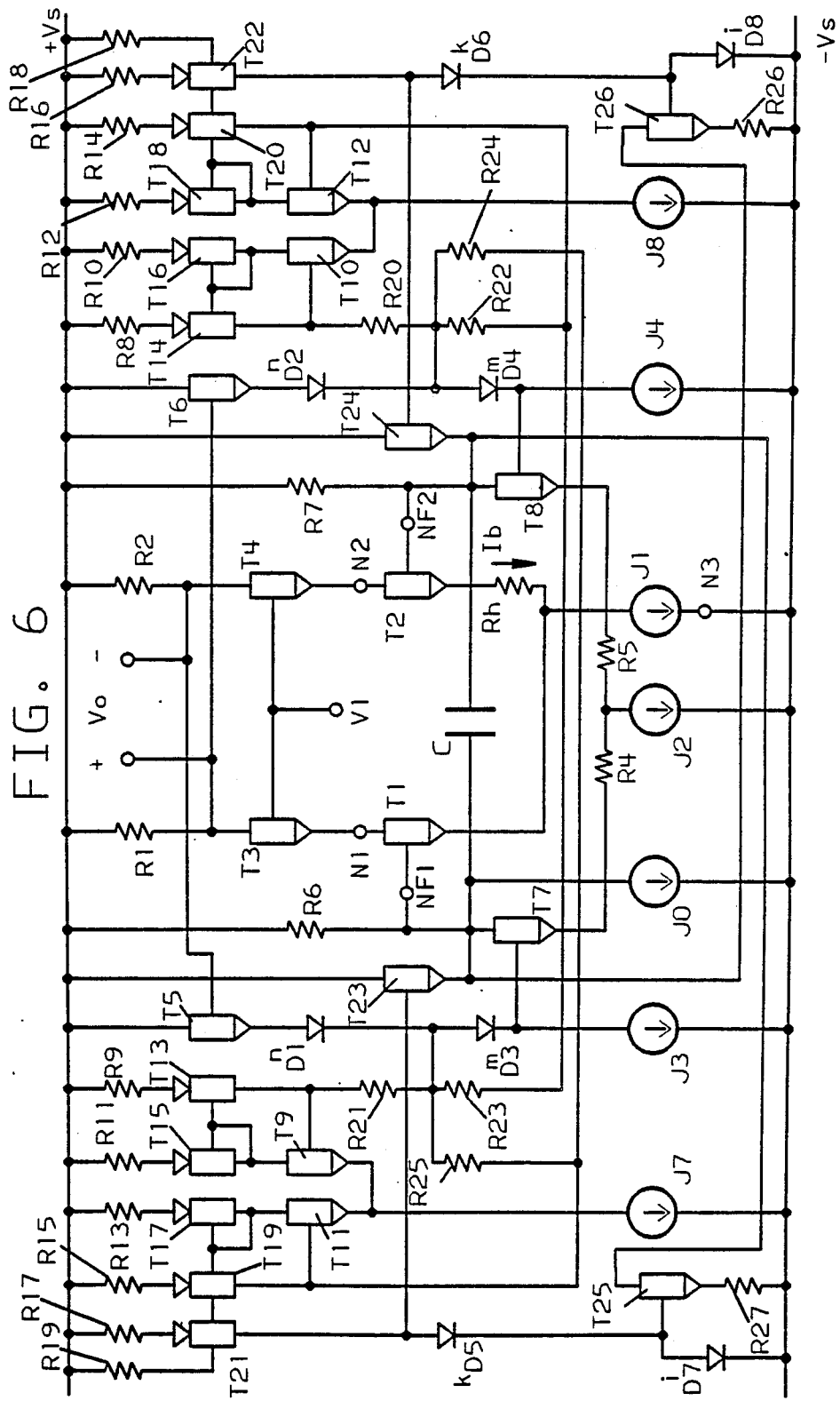
FIG. 6 is a circuit diagram of the amplifier of FIG. 5.

Referring now to FIG. 6, the basic input and common output feedback stages of FIG. 3 are coupled to an implementation of the non-linear feedback loop of FIG. 5. Separate reference voltages are derived from resistor dividers R22/R23 and R24/R25 to minimize interaction between the two comparators. Comparator CM2 comprises transistors T10, T12, T14, T16, T18 and T20. Diode D2 is used as a voltage level shifter.

During steady-state operation T10 is kept on (i.e. actively conducting current) by T14. The voltage developed across R20 is $V_{on}$. As the voltage at the base of T10 decreases and T12 turns on, T12 is kept on by T20. The voltage developed across R22 and R23 from T20 is equivalent to $V_{off}$. Diode D4 is used as a voltage level shifter for T8.

When the non-linear feedback loop is activated, transistor T22 supplies current to diodes D6 and D8. The voltage at the base of T24 and thus, one side of capacitor C is thereby clamped to a fixed voltage. At the same time, T26 will charge capacitor C toward the new steady-state voltage level in minimum time. Since diodes D7 and D8 represent a high impedance when current through them is small and a low impedance when current through them is large, the feedback loop is inherently non-linear for decreasing MR sensor switchover recovery time.

Figure 7:
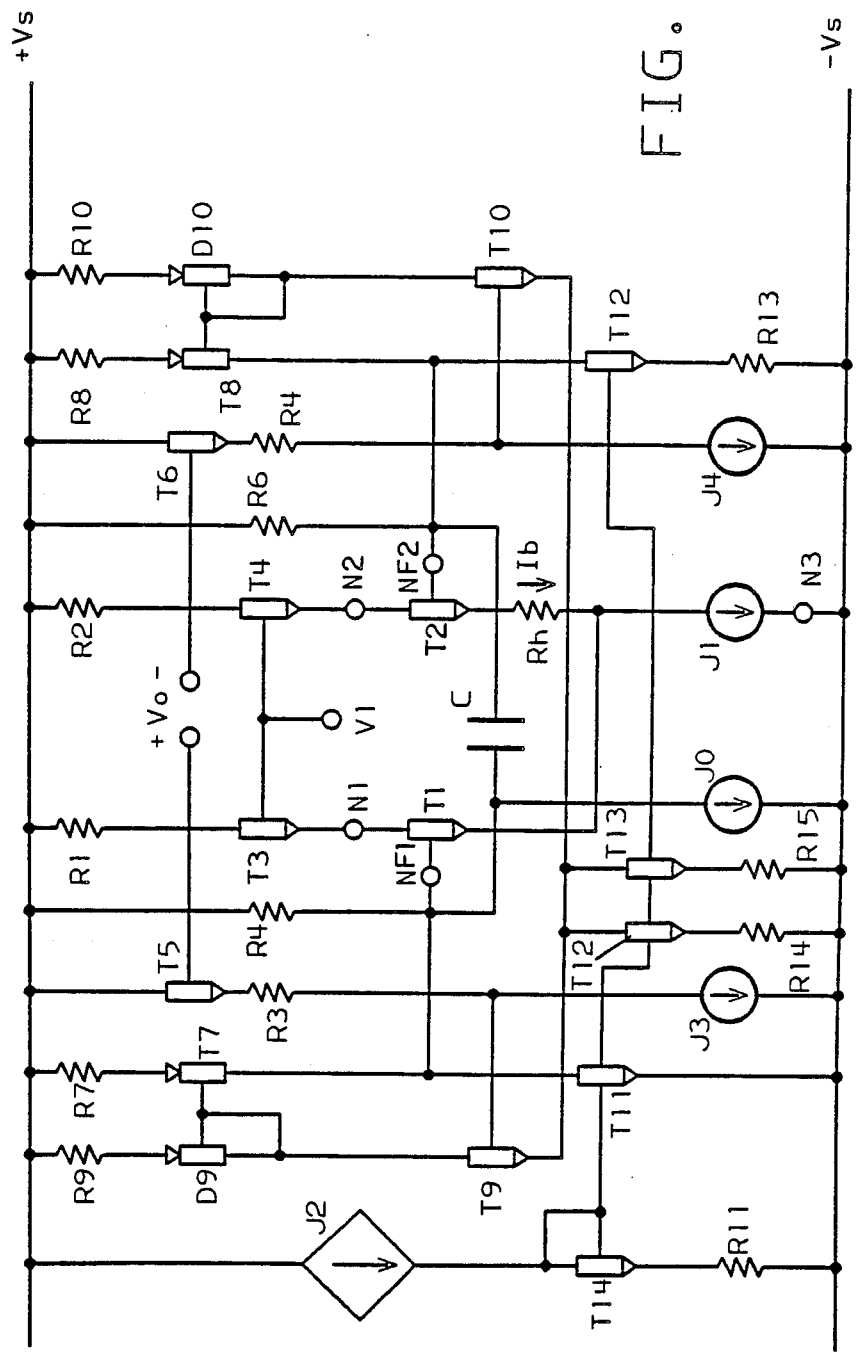
FIG. 7 is a circuit diagram of the amplifier of FIG. 2A including another embodiment of the enhancements of FIGS. 4 and 6.

A circuit for moving the dominant low frequency pole up in frequency while concurrently increasing available charging and discharging current to capacitor C is shown in FIG. 7. The circuit comprises a transconductance amplifier in a feedback loop in lieu of comparators, voltage reference levels and selectable voltage differences required by the circuits of FIGS. 4 and 6. In the circuit of FIG. 7, the current supplied from current source J2 is set to a low value for steady-state operation. That current, in turn, sets the value of the current flowing in transistors T9, T10, T12 and T13 to a value $I_{c1}$. Current $I_{c1}$ also flows through diodes D9 and D10 and transistors T7 and T8 and therefore becomes the current available to charge capacitor C. If $I_{c1}$ were increased to a value $I_{ch}$ at the moment of switchover, then both the available charge current to capacitor C and the loop gain would increase, thereby reducing capacitor charge time and moving the dominant low frequency pole up in frequency, respectively. After sufficient time for recovery has passed, the current supplied by current source J2 may be decreased to the initial value, $I_{c1}$, for steady-state operation. The rate of increase of current $I_{c1}$ to $I_{ch}$ can be controlled for smooth transition between switchover operation and steady-state operation of the circuit.

What is claimed is:

1. A circuit having first and second power supplies, for simultaneously biasing, and amplifying signals produced by, a magnetoresistive element having a steady-state resistance value, said circuit comprising:

a first current source coupled to the magnetoresistive element and to the second power supply for producing a current therethrough having constant time average value;

an input stage, having at least two transistors coupled in a first differential pair configuration and having the magnetoresistive element coupled to the emitter of one of said first differential pair of transistors and coupled to the first constant current source, for amplifying current deviations from said constant time average value of the current flowing through said magnetoresistive element; and output means, coupled to the input stage, for correcting variations in input stage voltage levels and for amplifying and transmitting signals received therefrom;

the collectors and bases of the said first differential pair of transistors being coupled to the output pair means, and the emitter of said other transistor of said differential pair being coupled to the first constant current source.

2. A circuit as in claim 1 wherein the signals amplified by said circuit are given by the relation $\Delta R_h$, where $\Delta R_h$ is the change in steady-state resistance, $R_h$, of the magneto-resistive element.

3. A circuit as in claim 1 wherein the output means includes:

at least two transistors coupled in a second differential pair configuration for correcting the voltage at the bases of the first differential pair; and first and second follower transistors, coupled to the first differential pair, for coupling the variations in the voltage levels produced in the input stage to the second differential pair;

said second differential pair being coupled to a second constant current source, and said follower transistors being coupled to third and fourth constant current sources, respectively.

4. A circuit as in claim 3 further including:

a plurality of input stages; and selection means for activating a first one of the plurality of input stages and deactivating all of the remaining plurality of input stages.

5. A circuit as in claim 4 further including:

transient suppression means for suppressing transients produced by deactivating one and activating another of the plurality of input stages.

6. A circuit as in claim 5 wherein the transient suppression means comprises:

a fifth constant current source coupled between the emitter of one of said follower transistors and the second power supply;

a resistor and a first and second diodes, each coupled parallel to each other and between the first and fifth constant current sources, the cathode of said first diode and the anode of said second diode being coupled to the fifth constant current source.

7. A circuit as in claim 4 further including enhancing means for decreasing input impedance presented to the magnetoresistive element and for increasing input impedance of the input stage.

8. A circuit as in claim 4 further including settling means for reducing the time required for said circuit to settle into steady-state operating after one of said input stages is deactivated and another of said input stages is activated.

9. A circuit as in claim 8 wherein the settling means includes:

first settling means for settling the circuit to steady-state operation when activating an input stage including a magnetoresistive element having a higher steady-state resistance value than the magnetoresistive element of the input stage being deactivated; and second settling means for settling the circuit to steady-state operation when activating an input stage including a magnetoresistive element having lower steady-state resistance value than the magnetoresistive element of the input stage being deactivated.

10. Apparatus for simultaneously biasing and amplifying signals produced by a magnetoresistive sensor when exposed to a changing magnetic field, said sensor having a steady-state resistance value, said apparatus comprising:

first means for receiving current from the magnetoresistive sensor, and for producing, in response thereto, signals representing the change in sensor resistance arising from changes in the magnetic field to which the sensor is exposed;

second means coupled to the first means for amplifying the signals produced thereby, and having an output for transmitting said amplified signals therefrom;

third means coupled to the first and second means for setting the frequency response of said apparatus, and fourth means coupled to the second means for substantially eliminating DC offset voltage at the output thereof.

11. Apparatus as in claim 10 wherein error signals produced by the third means are subtracted from the signals produced by the first means to provide preselectable high frequency response.

12. Apparatus as in claim 10 wherein the fourth means further includes means for feeding forward signals to eliminate DC offset voltage at the output of the second means.

13. Apparatus as in claim 10 wherein the second means divides the amplified signal by the steady-state value of the magnetoresistive sensor.

* * * * *